United States Patent [19]
Shur et al.

[11] Patent Number: 5,161,235
[45] Date of Patent: Nov. 3, 1992

[54] FIELD-EFFECT COMPOUND SEMICONDUCTIVE TRANSISTOR WITH GAAS GATE TO INCREASE BARRIER HEIGHT AND REDUCE TURN-ON THRESHOLD

[75] Inventors: Michael Shur, Charlottesville, Va.; Kwyro Lee, Seoul, Rep. of Korea

[73] Assignee: University of Virginia Alumni Patents Foundation, Charlottesville, Va.

[21] Appl. No.: 483,212

[22] Filed: Feb. 20, 1990

[51] Int. Cl.$^5$ .............................................. H01L 29/80
[52] U.S. Cl. ...................................... 257/24; 257/194
[58] Field of Search ................... 357/22, 22 A, 22 MD, 357/16

[56] References Cited

U.S. PATENT DOCUMENTS

| | | | |
|---|---|---|---|
| 4,424,525 | 1/1984 | Mimura | 357/22 A |
| 4,862,228 | 8/1990 | Ralph | 357/22 A |
| 4,905,059 | 2/1990 | Shur | 357/22 A |
| 4,907,048 | 3/1990 | Ando | 357/22 A |

FOREIGN PATENT DOCUMENTS

| | | | |
|---|---|---|---|
| 61-80871 | 4/1986 | Japan | 357/22 MD |
| 61-156888 | 7/1986 | Japan | 357/22 MD |
| 61-176160 | 8/1986 | Japan | 357/22 MD |
| 63-86575 | 4/1988 | Japan | 357/22 A |
| 63-90173 | 4/1988 | Japan | 357/16 |
| 1-14971 | 1/1989 | Japan | 357/22 A |

OTHER PUBLICATIONS

IEEE Transactions on Electron Devices, vol. ED-34, No. 2, Feb. 1987, "Design of Enhanced Schottky-Barrier AlGaAsl GaAs MODFET'S Using Highly Doped pt Surface Layers", by Priddy et al., pp. 175-179.

IEEE Transactions on Electron Devices, vol. ED-36, No. 5, May 1989, "Influence of Quantum Well Width on Device Performance of $Al_{0.30}Ga_{0.70}As/In_{0.25}Ga_{0.75}As$ (on GaAs) MODFET's ", by Nguyen et al., pp. 833-838.

IEEE Transactions on Electron Devices, vol. 37, No. 6, Jun., 1990, "High-Performance Self-Aligned p+In GaAs Epitaxial JFET's Incorporating AlGaAs Etch Stop Layer", by Abrokwah et al., pp. 1529-1531.

Primary Examiner—Rolf Hille
Assistant Examiner—Steven Loke
Attorney, Agent, or Firm—Finnegan, Henderson, Farabow, Garrett & Dunner

[57] ABSTRACT

Multi-layer heterostructure transistors, and methods for making them, involve the use of a p+ doped GaAs gate for an n-channel device to increase barrier height and reduce turn-on threshold. A p++-i-p substrate helps to reduce source and drain capacitances and control short-channel effects. Use of one relatively high temperature photoresist in the fabrication process facilitates alignment of ohmic contact depositions with the source and drain regions.

11 Claims, 9 Drawing Sheets

MESA-ETCH

ISOLATION IMPLANT

SiO₂ DEPOSITION

SiO₂ LIFT-OFF

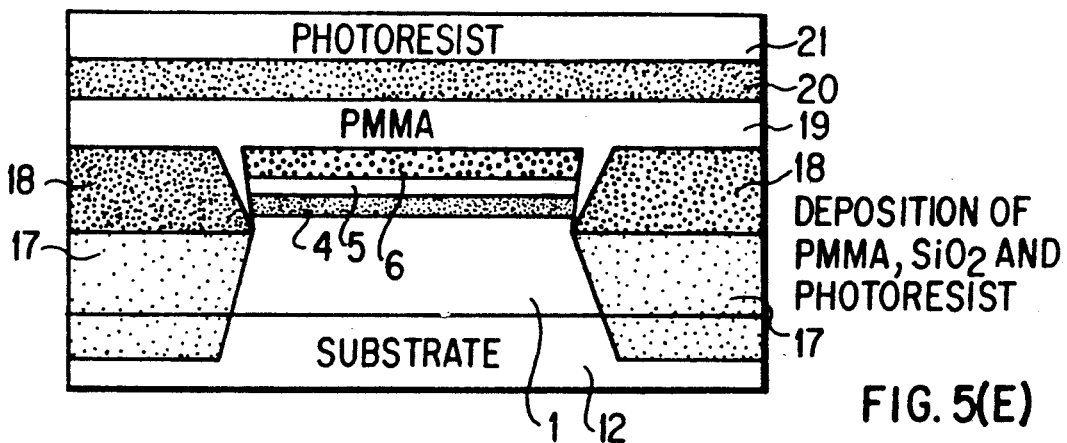
FIG. 5(E) DEPOSITION OF PMMA, SiO2 AND PHOTORESIST
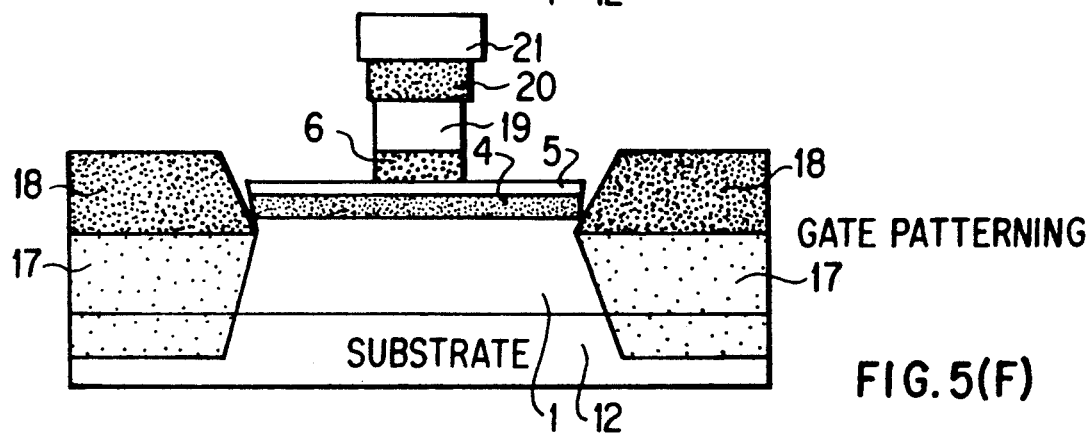
FIG. 5(F) GATE PATTERNING
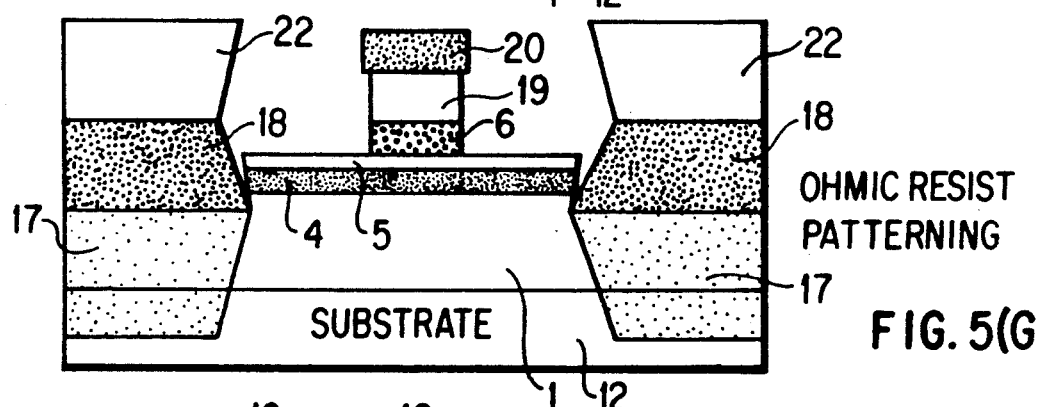
FIG. 5(G) OHMIC RESIST PATTERNING
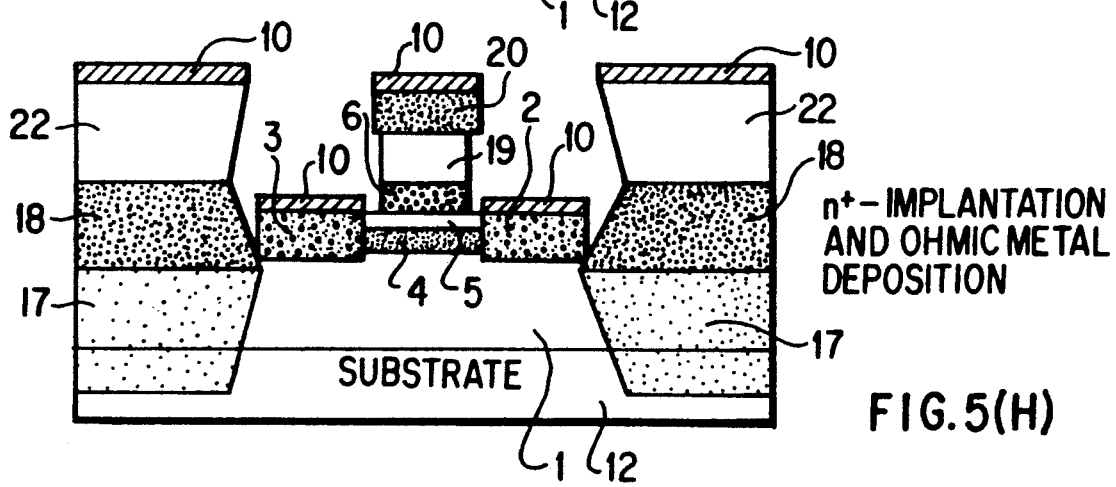
FIG. 5(H) n+-IMPLANTATION AND OHMIC METAL DEPOSITION SiO₂ DEPOSITION

LIFT-OFF

CONTACT OPENING

CONTACT METAL DEPOSITION AND LIFT-OFF

FIELD-EFFECT COMPOUND SEMICONDUCTIVE TRANSISTOR WITH GAAS GATE TO INCREASE BARRIER HEIGHT AND REDUCE TURN-ON THRESHOLD

FIELD OF THE INVENTION

This invention relates to field-effect transistors including but not limited to the heterostructure and MESFET (Metal-Semiconductor Field Effect Transistor) device types.

BACKGROUND OF THE INVENTION

It has long been a goal of research and industry to produce compound semiconductive devices which are integratable and are competitive with silicon devices across a much greater range of applications than the presently available high-speed or highly specialized types of devices. Technologies utilizing GaAs Metal-Semiconductor Transistors (MESFETs) and Heterostructure Field Effect Transistors (HFETs) have not yet been able to produce reliable ultra-fast VLSI circuits with acceptable yields.

Such devices are, nonetheless, attractive because it appears possible to achieve very low power-dissipation-times-delay products for such devices, which generally have very high electron mobilities.

It can be shown that a decrease in the power-delay product requires decreasing device size or decreasing the power supply voltage. Decrease in device size is limited by the fabrication technology and by the need to generate enough current to drive interconnecting circuits. The power supply or bias voltage is limited by the requirement of a sufficiently large noise margin of a logic gate.

Increasingly, it has appeared that noise margins are influenced by such parameters as source and drain series resistances and the voltage spans of the knees of the input-output voltage characteristics. The higher the electron mobilities, the lower the last-referenced voltage knee should be. However, gate leakage currents have remained a serious problem, as has also the variation of the threshold voltage from wafer to wafer.

In the article by R. Zuleeg et al., "VLSI Circuit Design and Performance of GaAs J-FET Technology", 1989 *URSI International Symposium on Signals, Systems and Electronics*, pp. 187–190 (published by Union Radio-Scientifique International, 1989, Federal Republic of Germany), a JFET technology is proposed to address the problem of the gate leakage current. Nevertheless, we do not find that solution to yield devices that are fast enough because of a low device transconductance.

SUMMARY OF THE INVENTION

According to our invention, a field-effect transistor comprises a substrate of a semiconductive material or an insulating material; a buffer layer of a first conductivity type disposed on the substrate; a channel region comprising a semiconductive material disposed on the buffer layer; a barrier layer of a wide bandgap semiconductive material or an insulating material disposed on the channel region; a gate layer of a semiconductive material of the first conductivity type disposed on the barrier layer; a source region of the second conductivity type contacting the channel region proximate a first end of the channel region; a drain region of the second conductivity type contacting the channel region proximate a second end of the channel region; ohmic contact metal regions respectively disposed on the source and drain regions; and a gate metal contact disposed on the gate layer.

Our invention further comprises a method for making a field-effect transistor, including the steps of successively forming on a compound semiconductive substrate a buffer layer, a quantum well layer, a barrier layer and a gate layer by at least one vapor-based process; depositing a first photoresist on the gate layer; patterning the photoresist, etching the deposited layers; implanting isolation regions; depositing a first insulating layer; removing residual photoresist and material of the insulating layer occurring over the photoresist; depositing a second photoresist; successively depositing a second insulating layer and a third photoresist thereover; patterning the third photoresist; etching the layers down through the gate layer to form a gate structure; removing the residual third photoresist; depositing a fourth photoresist; patterning and etching the fourth photoresist; implanting source and drain regions using the gate structure for an implantation alignment guide; depositing ohmic contact metal similarly aligned; depositing an insulating layer; removing all residual photoresist layers and layers thereover; photolithographically defining contact openings; and depositing gate metal contacts to the gate layer and metal interconnects for ohmic contact metal of the source and drain regions.

Our invention additionally comprises a field-effect transistor of a first conductivity type, comprising a substrate of a semiconductive material or an insulating material; a buffer layer disposed on the substrate; a channel region comprising a semiconductive material disposed on the buffer layer; a source region of the first conductivity type in contact with a first end of the channel region; a drain region of the first conductivity type in contact with a second end of the channel region; a gate region disposed above the channel; wherein the buffer layer includes a first layer of heavily doped semiconductive material of a second conductivity type and disposed on the substrate, a second layer of undoped semiconductive material or insulating material disposed on the first layer, and a third layer of semiconductive material of the second conductivity type in contact with the channel region.

It is one advantage of a substrate according to our invention that it can at least be used both with heterostructure devices and metal-semiconductor type field-effect devices.

BRIEF DESCRIPTION OF THE DRAWINGS

Further features and advantages of our invention will become apparent from the following detailed description, or may be acquired from the practice of the invention, taken together with the drawings, in which:

FIGS. 5A–5L illustrate a method for making the transistor of FIG. 1 according to still another feature of our invention.

DETAILED DESCRIPTION

Figure 1:
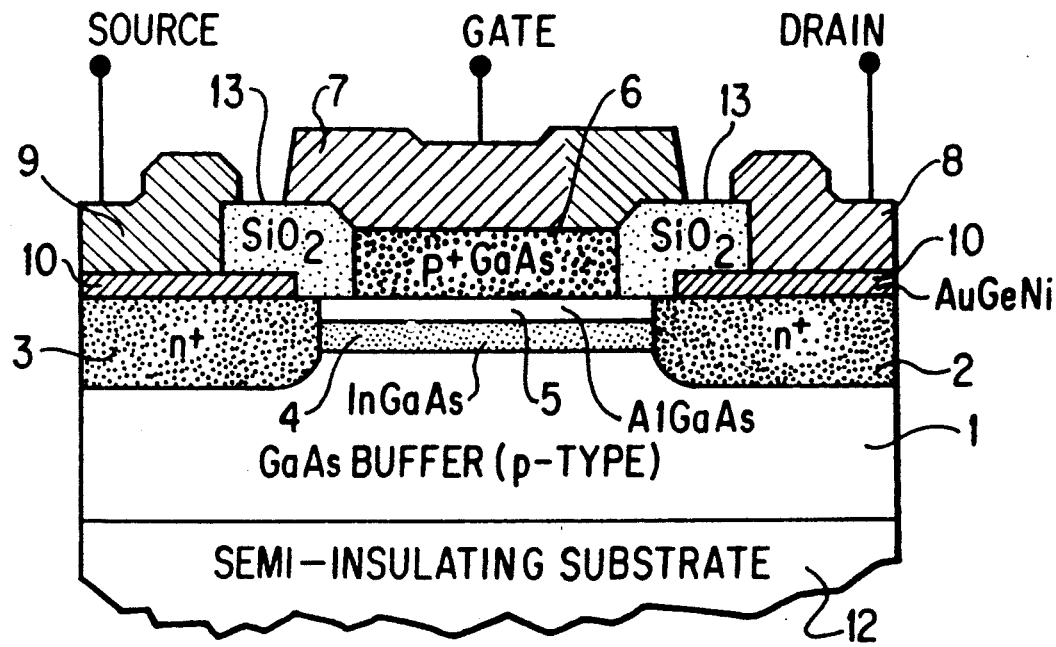
FIG. 1 is a pictorial cross-section of a heterostructure field effect transistor according to a preferred embodiment of the invention.

In FIG. 1, an HFET is formed on a semi-insulating substrate 12. A GaAs buffer (p-type) layer 1 is disposed on semi-insulating substrate 12. Heavily doped n-type regions 3 and 2 serve as source and drain regions respectively. An InGaAs quantum well channel layer 4 is located between source and drain regions 3 and 2. Quantum well channel region 4 may be intrinsic or n-type. A wide bandgap AlGaAs charge controlling barrier layer 5 is formed on the quantum well region 4. Layer 5 may be intrinsic or n-type. A heavily doped p-type GaAs gate electrode 6 is disposed on the barrier layer 5. Alternatively, or additionally, an n-type layer may be disposed in the GaAs buffer layer 1 adjacent to quantum well layer 4. Ohmic metal elements 10 (AuGeNi) insure good ohmic contact to source and drain regions 3 and 2. Metallizations 9, 7, and 8 respectively contact source 3, gate 6, and drain 2. Silicon dioxide layers 13 isolate metallizations 9, and 7, and 8.

The aforementioned problems associated with conventional HFETs have been solved by providing a heavily doped p-type gate 6, with e.g., dopant concentrations of $1 \times 10^{20}$ per cc. As a result of the heavy doping of gate 6, metallization 7 forms an ohmic contact therewith. The heavy p-type doping of the gate 6 increases the effective barrier height to roughly 1.7 eV, approximately the bandgap of AlGaAs. The large barrier height of the HFET of the present invention reduces leakage current and mitigates the real space transfer problem, i.e., the transfer of electrons from the channel into the minimum of the conduction band in AlGaAs charge control layer 5. Furthermore, the p-type doping of the buffer layer 1, even if merely around an n-type layer therein, suppresses sub-threshold current and drastically reduces sidegating, backgating, and short-channel effects. (See further discussion in respect to the embodiment of FIG. 4.) In addition, a bias voltage may be applied to the p-type buffer layer 1 in order to adjust device threshold voltage. Although HFETs can achieve excellent threshold voltage uniformity over a wafer, the spread of the threshold voltages from wafer-to-wafer can be very large. Consequently, a circuit that automatically adjusts the voltage applied to the p-type buffer layer 1, depending on the device threshold, may be employed. This circuit may be integrated on the HFET chip. Alternatively, a back bias may be applied externally.

Figure 5A:
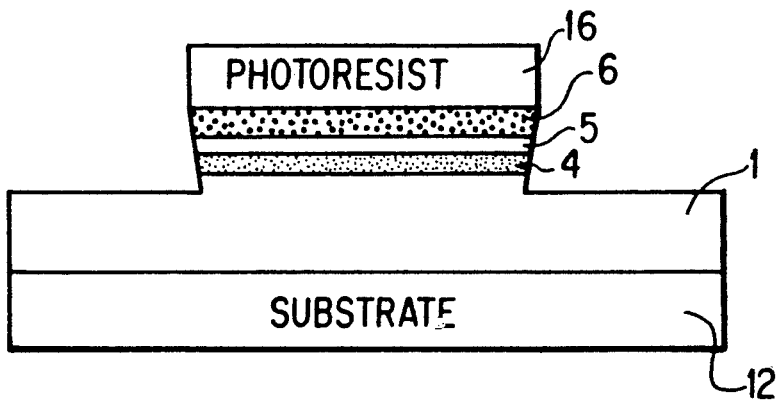
Figure 5B:
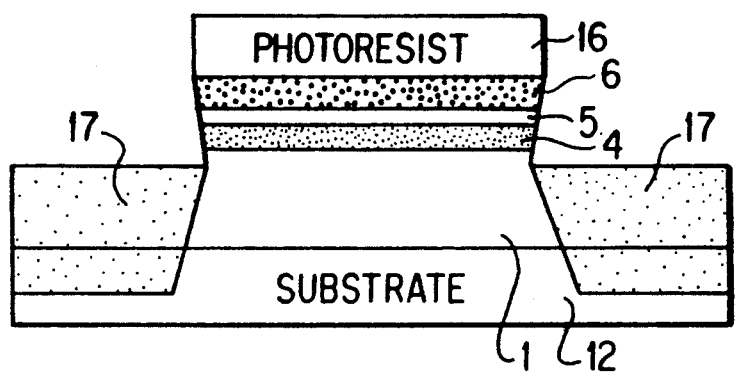
Figure 5C:
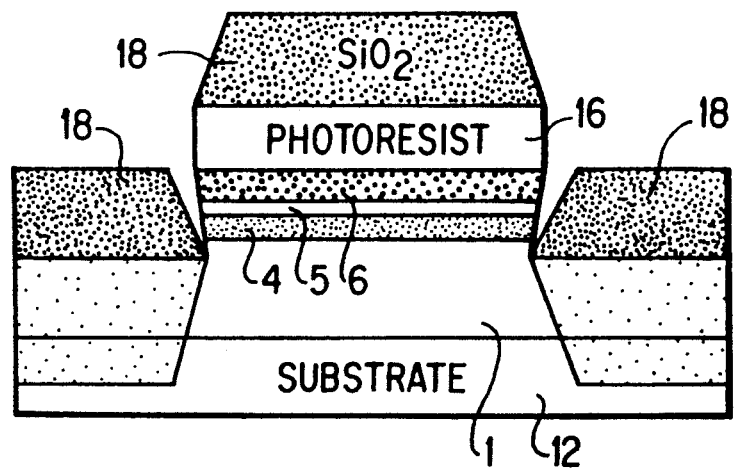
Figure 5D:
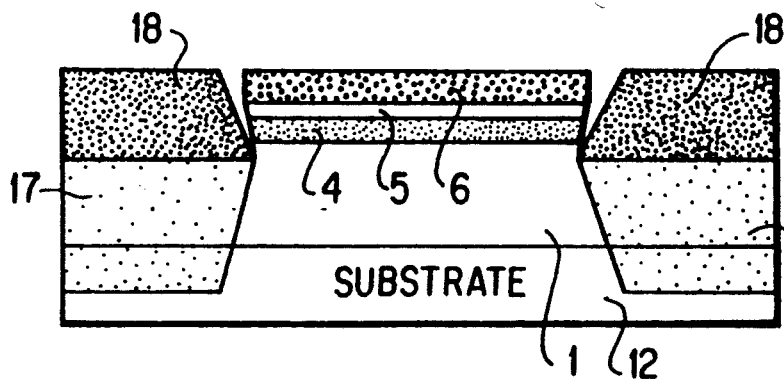

A first embodiment of the device shown in FIG. 1 can be fabricated using a modified SAINT process (see K. Yamasaki, K. Asai, T. Mizutani, and K. Kurumada, *Self-Alioned Implantation for n+-layer Technology (SAINT) for high speed GaAs ICs*, Electron. Lett., 18(3), pp. 119–121, 1982). This modified SAINT process will now be described in reference to FIGS. 5(A)–5(L). Initially, GaAs buffer layer 1, InGaAs quantum well channel layer 4, AlGaAs barrier layer 5, and p+ GaAs gate layer 6 are successively formed on substrate 12. These layers may be formed by either molecular beam epitaxy or organo-metallic chemical vapor deposition. A layer of photoresist 16 is then deposited on p+ GaAs gate layer 6. Photoresist layer 16 is then patterned using conventional photolithographic techniques. Layers 4, 5, and 6 are then mesa-etched as shown in FIG. 5(A). As seen in FIG. 5(B), impurities such as protons or boron or oxygen are implanted in order to realize isolation regions 17. In FIG. 5(C), silicon dioxide layer 18 is then deposited. Silicon dioxide layer 18 is provided in order to insure proper isolation. As depicted in FIG. 5(D), silicon dioxide deposited on photoresist 16 is lifted off by a standard lift-off procedure. In FIG. 5(E), PMMA layer 19, silicon dioxide layer 20, and photoresist layer 21 are successively deposited. As seen in FIG. 5(F), the photoresist layer 21 is patterned and layers 20, 19, and 6 are etched. This step patterns the p+ GaAs gate 6. In FIG. 5(G), photoresist layer 21 is removed and photoresist layer 22 is deposited and patterned. As seen in FIG. 5(H), donor impurities are implanted in order to form source and drain regions 3 and 2. Following the source and drain implants, the ohmic metal contacting layer 10 is deposited. Note that in this modified SAINT process, the portions of ohmic contacting layer 10 deposited on source and drain regions 3 and 2 are self-aligned to layer 20. This self-alignment results in a very small distance between the ohmic metal contact covering source and drain regions 3 and 2 and channel layer 4. This in turn advantageously results in small parasitic source and drain series resistances.

Figure 5I:
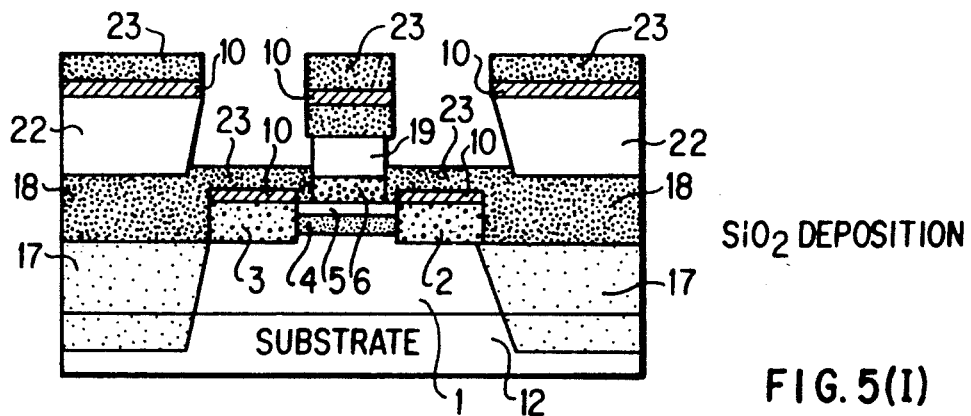
Figure 5J:
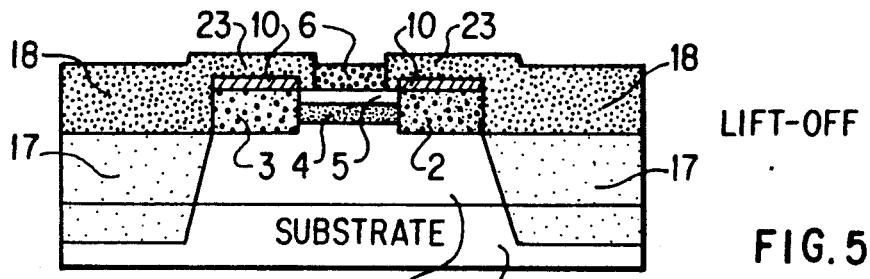
Figure 5K:
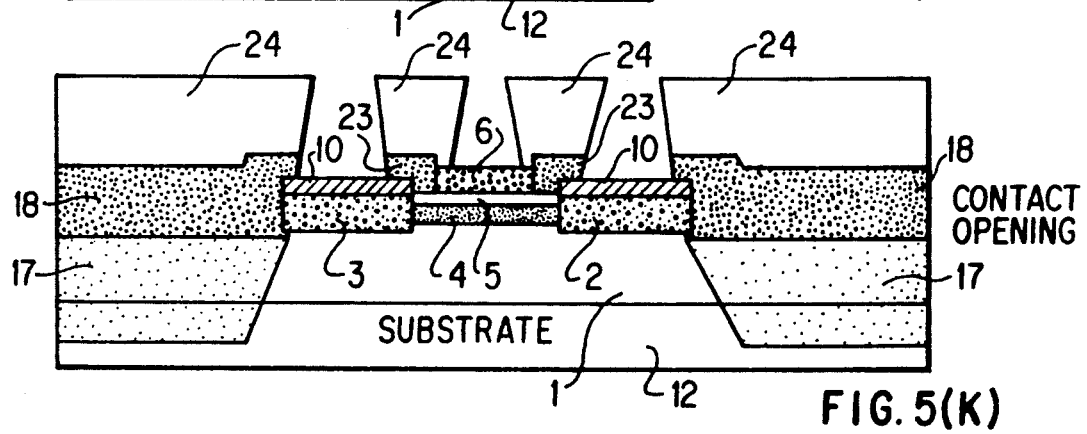
Figure 5L:
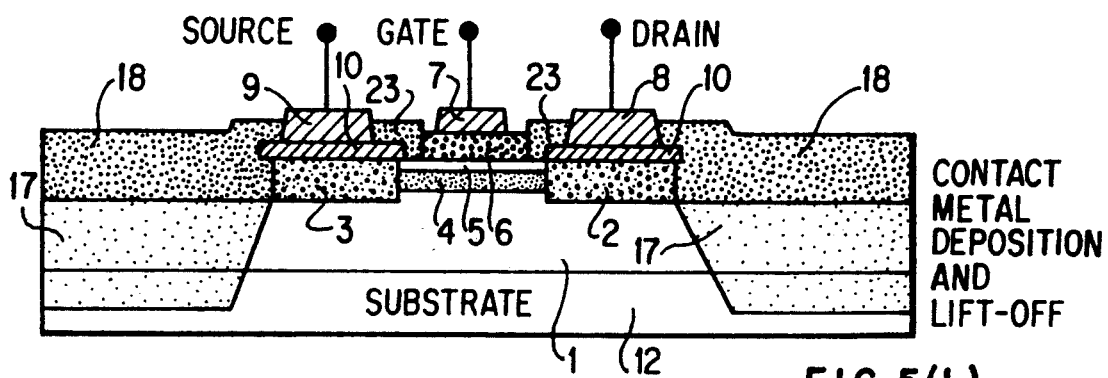

Continuing with the description of the modified SAINT process, in FIG. 5(I), silicon dioxide layer 23 is deposited next. As seen in FIG. 5(J), those sections of silicon dioxide layer 23 and ohmic metal layer 10 which are deposited on photoresist layer 22 are removed along with photoresist layer 22 in a standard lift-off process. In FIGS. 5(K) and 5(L) the illustration of the device is enlarged. In FIG. 5(K), photoresist layer 24 is deposited and source, gate, and drain contact openings are patterned. As shown in FIG. 5(L), source, gate, and drain metal contacts 9, 7, and 8, respectively, are formed and photoresist layer 24 is removed.

Figure 2:
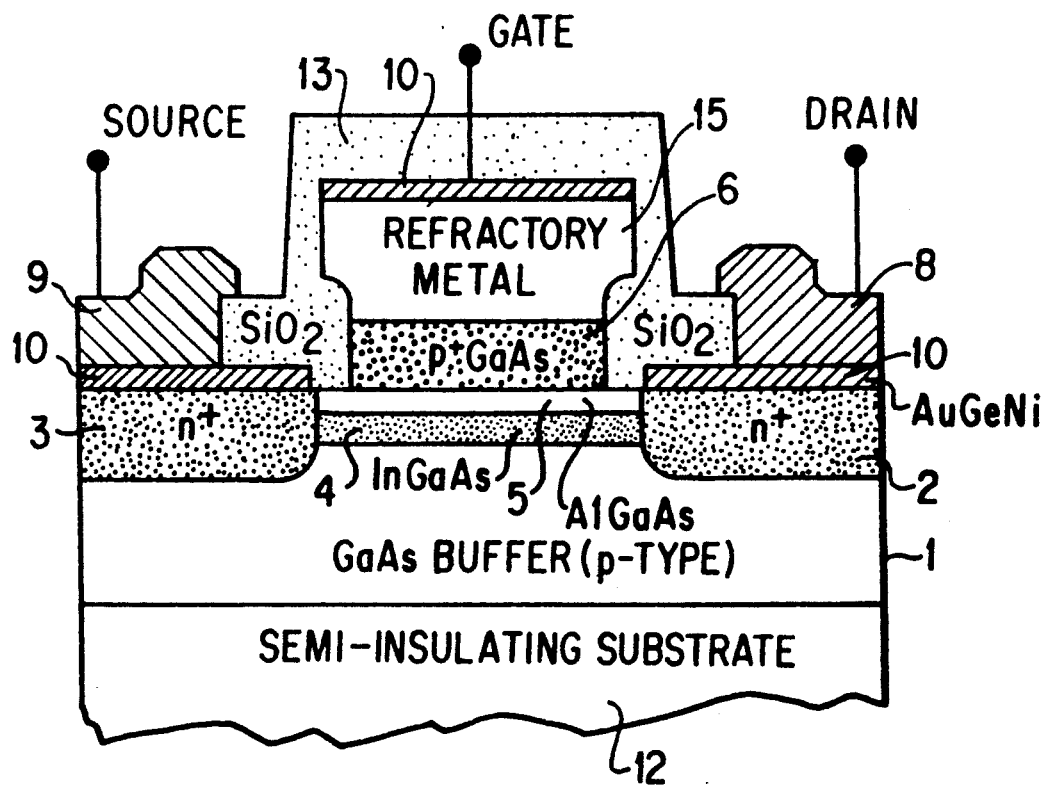
FIG. 2 is a pictorial cross-section of a modified fieldeffect transistor according to the invention.
Figure 3A:
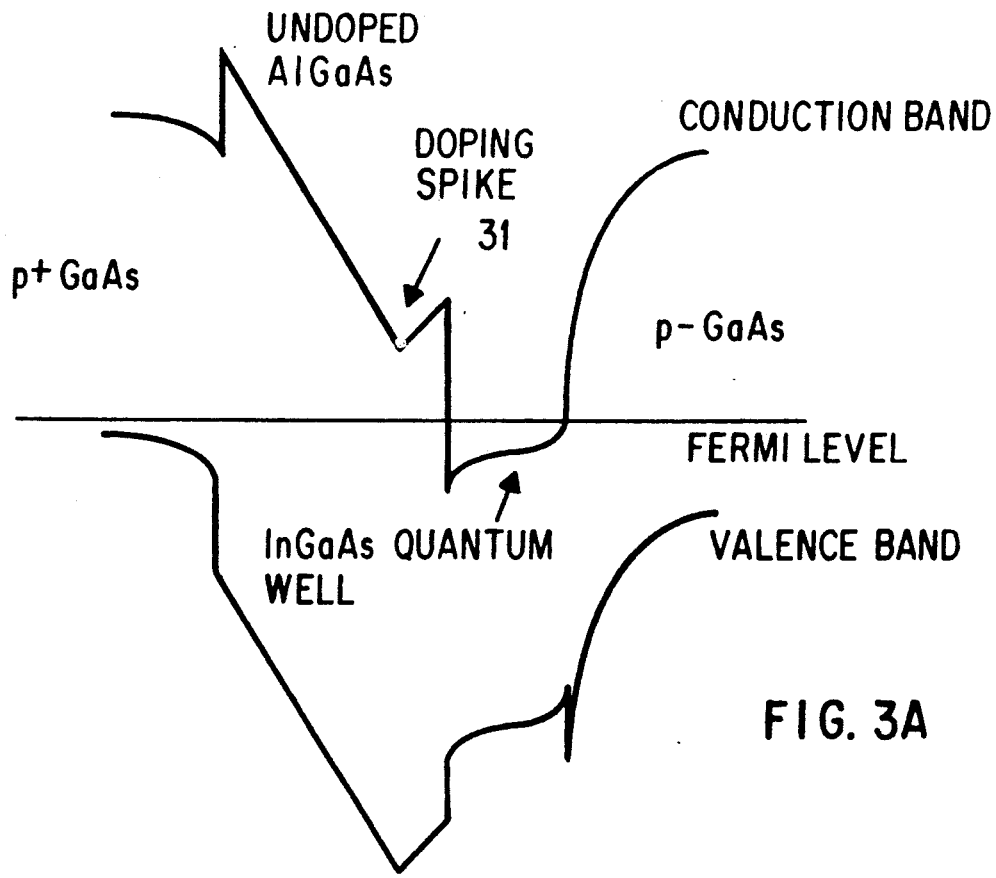
FIGS. 3A and 3B show two variants of energy band diagrams for the embodiments of FIG. 1 and FIG. 2.
Figure 3B:
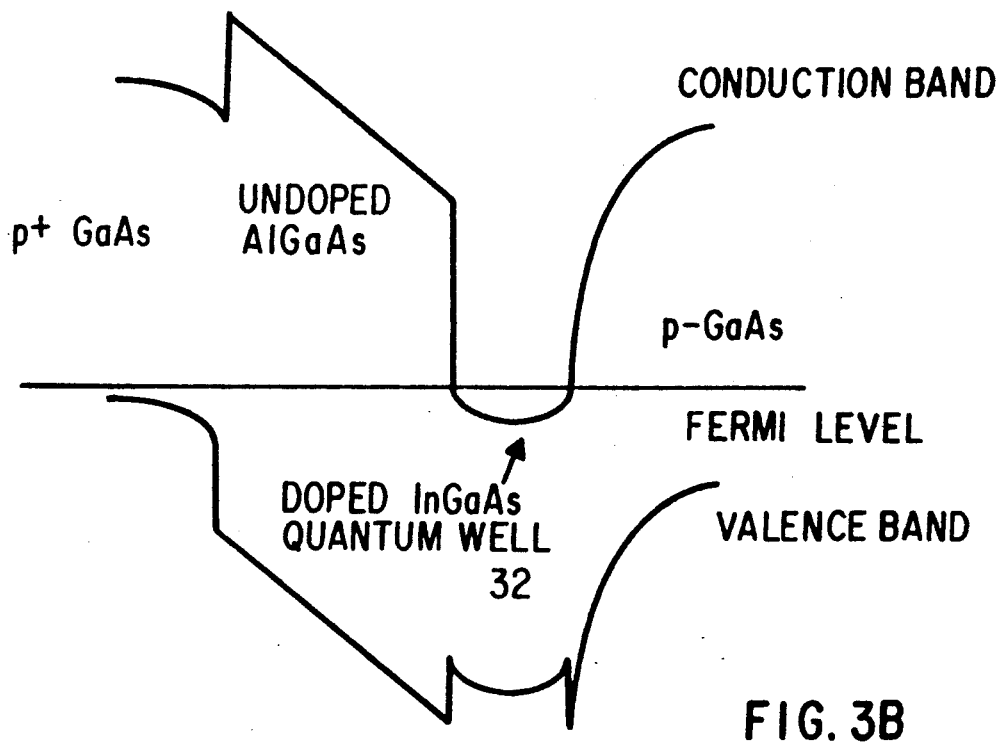

FIG. 2 depicts an alternative embodiment of the present invention. In this embodiment, a T-shaped refractory metal gate contact 15 is disposed on p+ GaAs gate 6, with ohmic metal 10 deposited on top of contact 15. Note that like numerals identify corresponding structures shown in FIG. 1. As a result of the heavy doping of gate 6, gate contact 15 forms an ohmic contact therewith.

Figure 4:
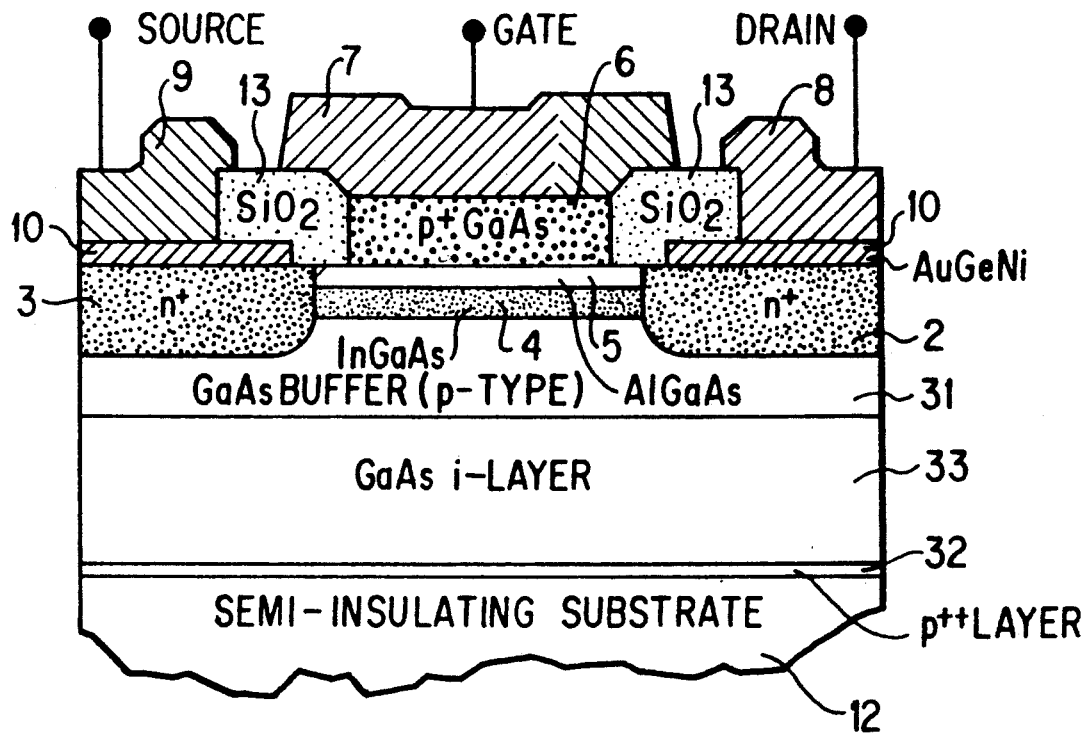
FIG. 4 shows a modification of the embodiment of FIG. 1 to use a tri-partite substrate according to one above-described feature of our invention.

In yet another embodiment, the p-type buffer layer is replaced by a p-i-p++ layer consisting of a p-type layer 31 of GaAs, instrinsic layer 33 and a more heavily doped p++ layer 32 of GaAs, as shown in FIG. 4. The p-type layer 31 is provided in order to reduce short channel effects. The n+ source and drain regions 3 and 2 may extend through the p-GaAS layer 31 and into the undoped i-GaAs layer 33.

The p++ layer 32 reduces ground bouncing problems and sidegating. Furthermore, p++ layer 32 facilitates the application of a back bias in order to control threshold voltage. As noted above, this back bias may be applied by a circuit integrated on the HFET chip. The back bias may also be externally applied for the control of the device turn-on threshold.

Figure 6:
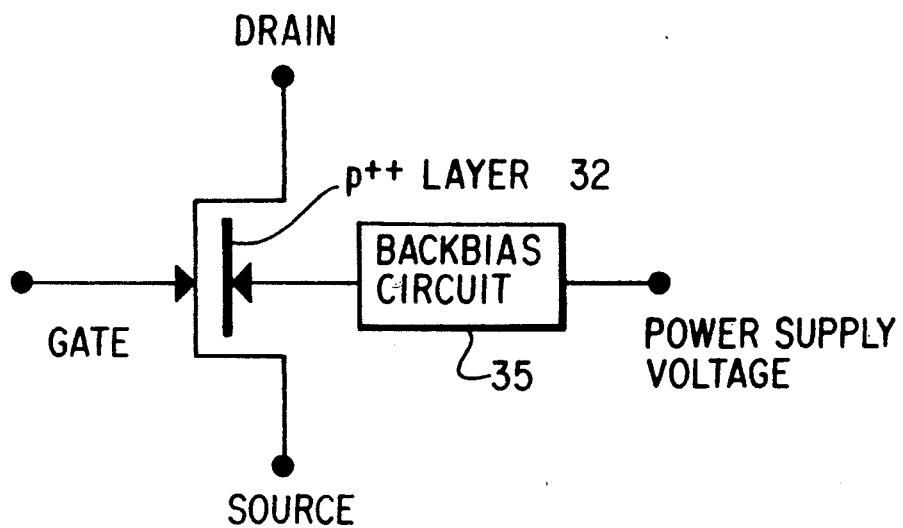
FIG. 6 illustrates a circuit representation of the device illustrated in FIG. 4 including a back bias circuit.

FIG. 6 illustrates a circuit representation of the HFET of FIG. 4 with the p++ layer 32 diagrammatically illustrated. A back bias circuit 35, such as may be integrated onto the HFET chip, is included for generating a back bias voltage from the power supply voltage for application to the p++ layer 32. The construction of an exemplary back bias circuit for use in silicon DRAMs is disclosed in the paper entitled "Digital Integrated Circuits: A Tutorial" by M. I. Elmarsry, published in Digital Integrated Circuits, edited by M. I. Elmarsry, pp. 4–27, IEEE Press, 1981.

Figure 7A:
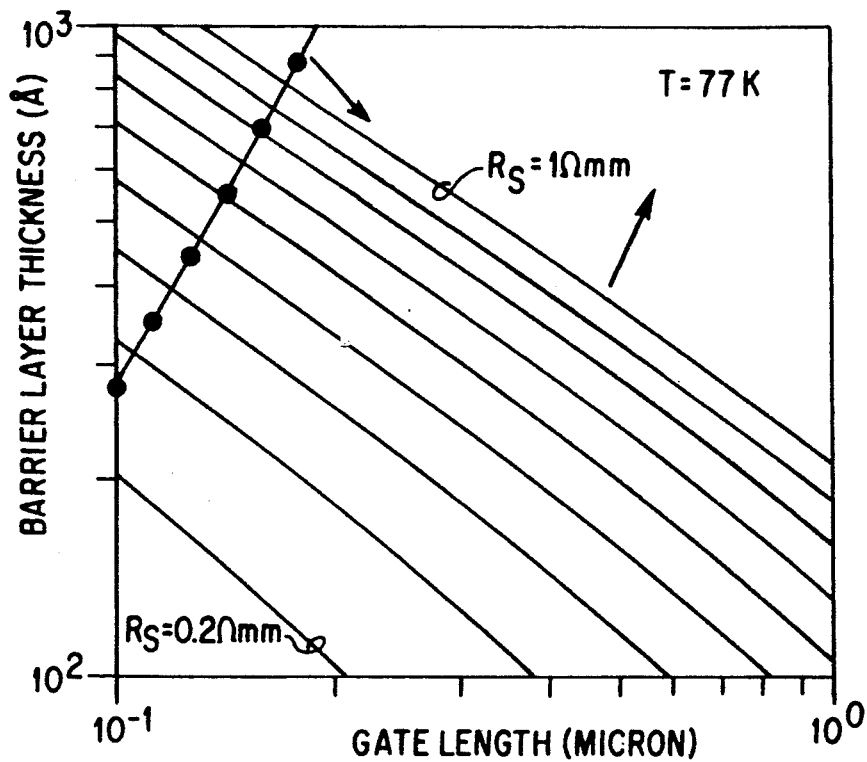
FIGS. 7A and 7B graphically illustrate relationships between barrier layer thickness and gate length for the devices illustrated in FIGS. 1, 2 and 4.
Figure 7B:
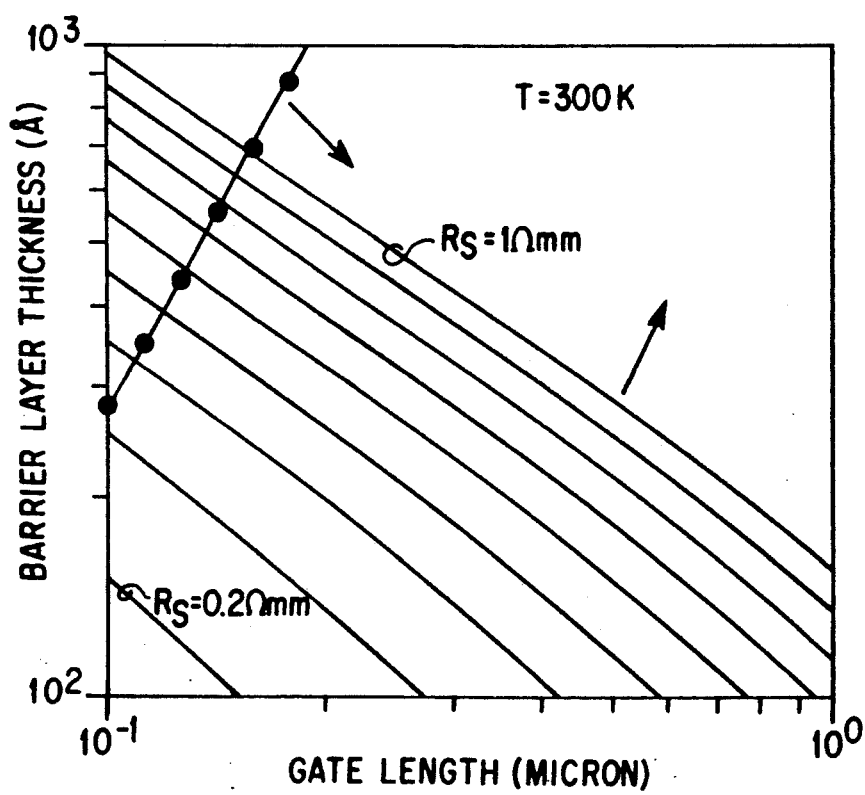

FIGS. 7A and 7B illustrate preferred relationships between the thickness of barrier layer 5 (in Ångstroms) and the gate length (in microns) for the devices illustrated in FIGS. 1, 2 and 4. FIG. 7A illustrates the relationship for an ambient temperature of 77° K., while FIG. 7B illustrates the relationship for an ambient temperature of 300° K. In both FIGS. 7A and 7B, the set of nine solid lines extending from upper left to lower right respectively correspond to different values of source series resistance. The uppermost and lowermost ones of these solid lines respectively correspond to a source series resistance of 1 Ω mm and 0.2 Ω mm. Commencing from the uppermost solid line, the lines respectively represent decreasing values of series resistance in increments of 0.1 Ω mm; i.e., 0.9 Ω mm, 0.8 Ω mm, 0.7 Ω mm, etc. The black arrows point in the direction of the acceptable region of device parameters for a particular source series resistance.

Figure 8:
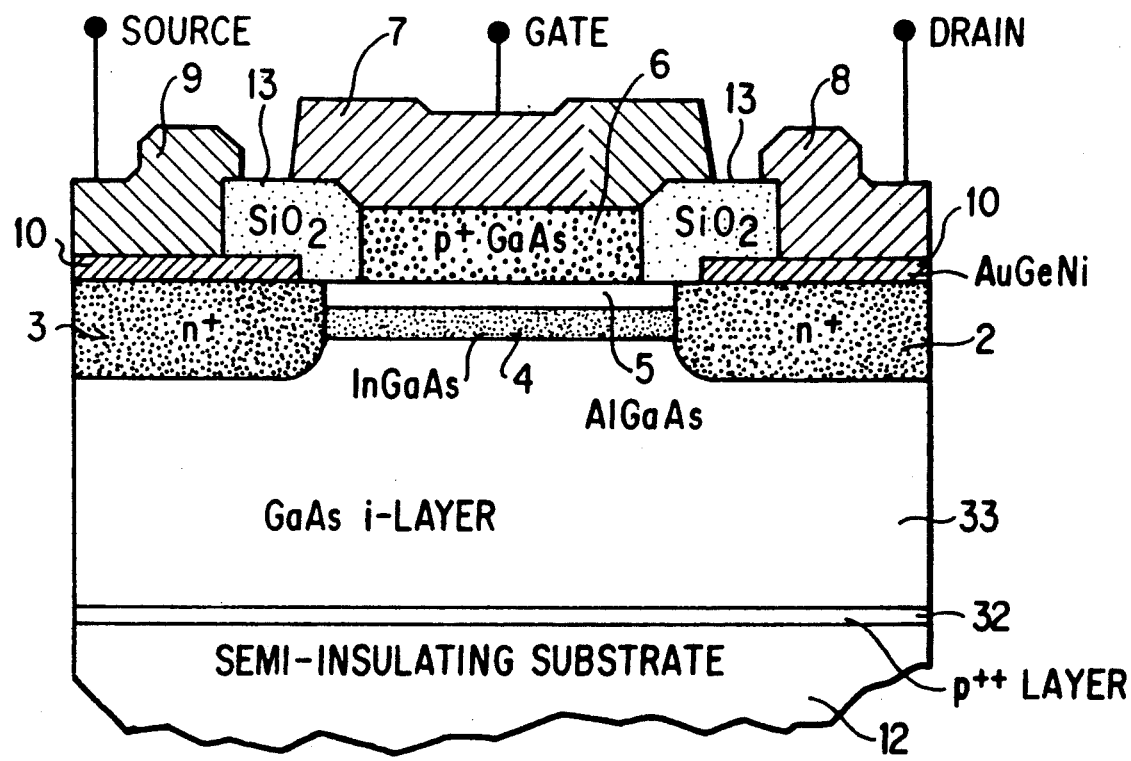
FIG. 8 illustrates a modification of the device illustrated in FIG. 4 for application in long channel devices.

FIG. 8 illustrates a modification of the HFET device shown in FIG. 4 in which p-type layer 31 is not provided. As a result, intrinsic layer 33 contacts layer 4. This construction of the HFET is particularly intended for long channel devices.

In accordance with the preferred practice of the present invention, the p-i-p++ layer illustrated in FIG. 4 is used in the construction of n-channel devices. However, where layer 31 is not provided, as described above with respect to long channel devices, the device may be constructed as either a p-channel or n-channel device. Further, the above-described advantages resulting from a device construction including the p-i-p++ layer can also be realized in an FET device constructed with an n-i-n++ layer between the substrate and a p-type channel. Additionally, a long channel device can be constructed using an i-n++ layer between the substrate and either a p- or n-type channel.

With respect to the devices illustrated in FIGS. 1, 2, 4 and 8, the barrier layer may be made of other large band gap materials besides AlGaAs. In addition, other narrow band gap materials besides InGaAs may be used as a quantum well channel layer. Furthermore, relatively narrow band gap materials may be used instead of GaAs. With respect to the devices illustrated in FIGS. 1, 2 and 4, layer 1 in FIGS. 1 and 2 or layer 31 in FIG. 4 can be replaced with a p-i-p-i doping superlattice or a hetrostructure structure superlattice consisting of alternating parallel layers of narrow band gap and wide band gap materials with p-type dopant introduced either into the narrow band gap material, wide band gap material, or both.

In FIGS. 1, 2 and 4, AlGaAs layer 5 can be replaced with an n-i-n-i doping superlattice or a hetrostructure superlattice consisting of alternating parallel layers of narrow band gap and wide band gap materials with n-type dopant introduced either into the narrow band gap material, wide band gap material, or both.

For the embodiments of FIG. 1 and FIG. 2, FIGS. 3A and 3B show the qualitative band diagrams of the heterostructure FET with a doping spike and heterostructure FET with a doped InGaAs quantum well channel, respectively. In these structures, the effective barrier height is of the order of Eg = 1.7 V where Eg is the energy gap of AlGaAs. Just as in GaAs JFETs, the purpose of the p+ gate is to increase the barrier height. Here, the effective barrier height is limited by the whole energy band gap as in JFETs; and the enhancement in the effective barrier height is larger than in other technologies.

Another feature of the devices of FIGS. 1 and 2 is the use of intentionally doped p-type buffer layer 1. The p-type doping of a buffer layer is effective to suppress the subthreshold current and drastically reduce sidegating, backgating, and short-channel effects.

The n-type doping in the heterostructure FET devices of FIGS. 1 and 2 can be introduced either during epitaxy or by ion implantation. The dopants can be located in the charge controlling barrier layer 5, preferably as a doped spike in layer 5, in the InGaAS channel layer 4, or both and/or as a doping spike in the buffer layer 1. There are fewer problems with traps when dopants are located in InGaAs layer 4 as opposed to in AlGaAs 5.

The proposed HFET technology of FIGS. 1–7 can satisfy the requirement of low gate leakage current since the effective barrier height can be of the order of the energy gap of the wide-band material, such as AlGaAs. Even larger energy band discontinuities may be advantageous for further reduction of the gate leakage current. One possible approach is using InP to construct layers 1, 5, 6 and 12 in FIGS. 1 and 2, or using InP i to construct layers 5, 6 and 31–33 in FIG. 4. This is because larger energy band discontinuities reduce the gate leakage current and real space transfer even further.

While the devices illustrated in FIGS. 1, 2, 4 and 7 have been described as constructed on semi-insulating substrate 12, these devices also can be constructed on a substrate composed of a dielectric material.

While the HFET devices of the present invention have been described as being constructed using an AlGaAs-GaAs materials system, the invention is not so limited. HFET devices similar to those illustrated and described herein can be implemented using other III-V compounds, II-VI compounds, a Si-Ge materials system, SiC polytypes, or a polysilicon materials system.

Figure 9:
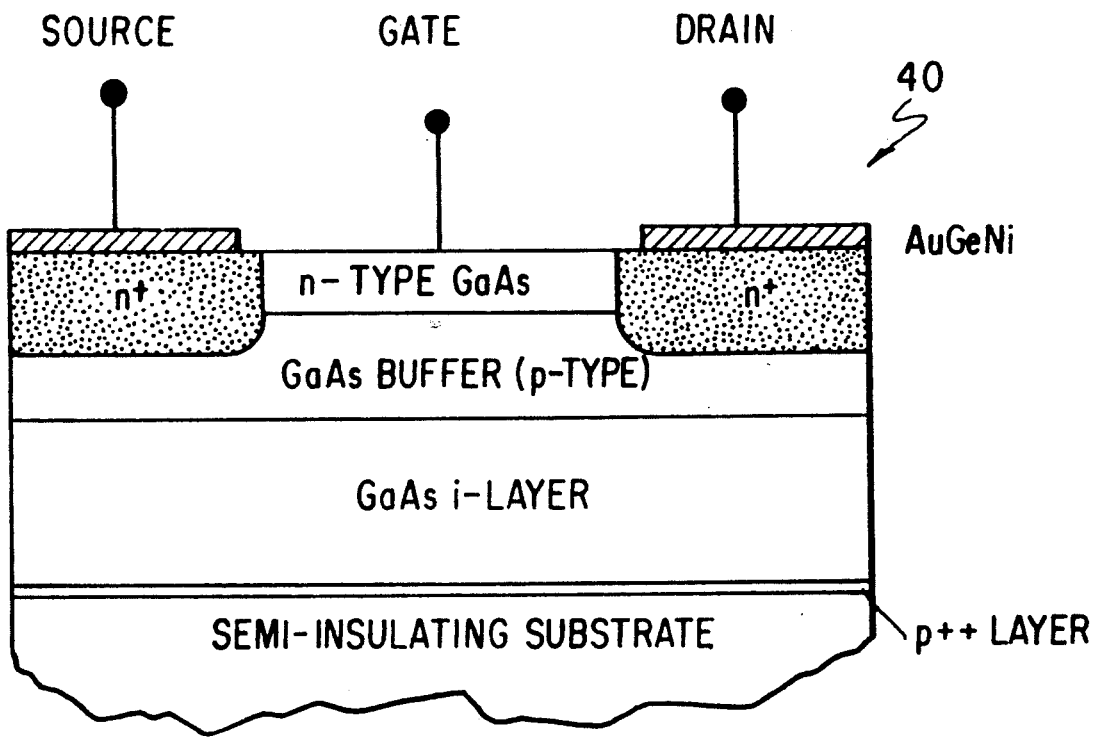
FIG. 9 illustrates a MESFET device constructed to include a tri-partite substrate.

While the p-i-p++ layer has been described above and illustrated with respect to its use in hetrostructure FETs, the invention is not so limited. The p-i-p++ layer can be used to achieve the above described advantages in the construction of a MESFET device such as the exemplary MESFET 40 illustrated in FIG. 9.

Figure 10:
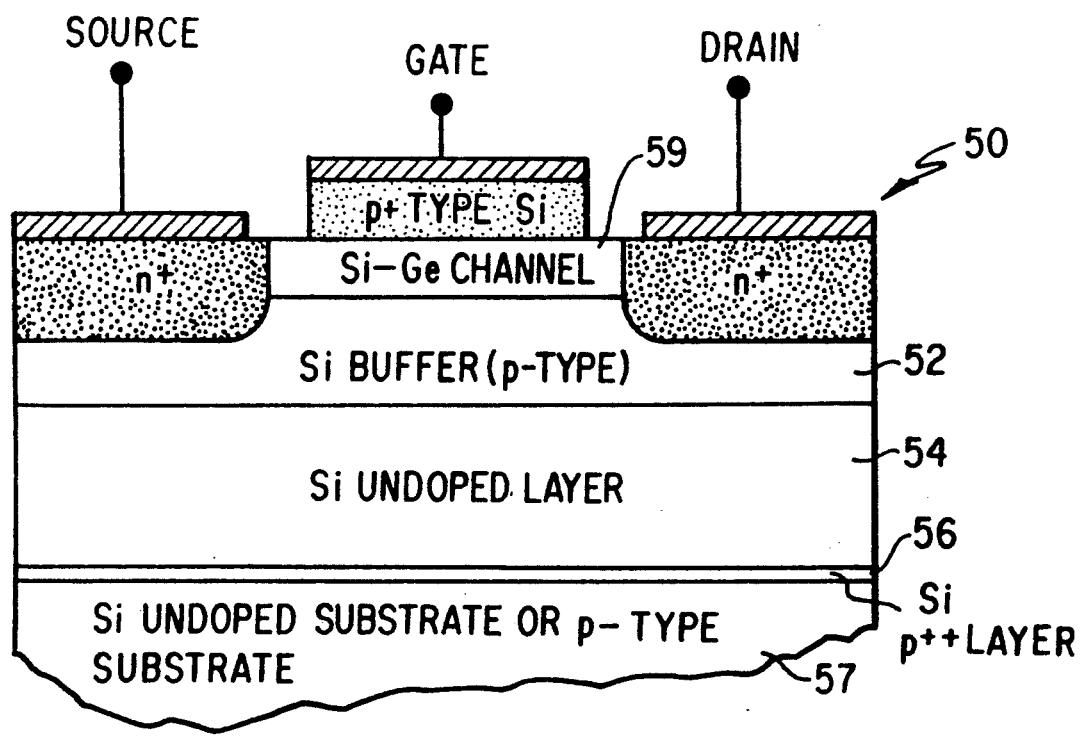
FIG. 10 illustrates a SiGe HFET device constructed to include a tri-partite substrate.

Further, while the p-i-p++ layer has been described above and illustrated with respect to its use in FETs constructed using GaAs, the p-i-p++ layer can be used to achieve the above described advantages in the construction of FETs using silicon. For example, a SiGe HFET 50 and Si MOSFET 60 each including the p-i-p++ layer are respectively illustrated in FIGS. 10 and 11. SiGe HFET 50 illustrated in FIG. 10 includes a p-type silicon buffer layer 52, an undoped Si layer 54 and a more heavily doped p++ Si layer 56. Layers 52, 54 and 56 are disposed between substrate 57 that can be provided as either an insulating or a semiconductive layer, and a Si-Ge channel 59.

Figure 11:
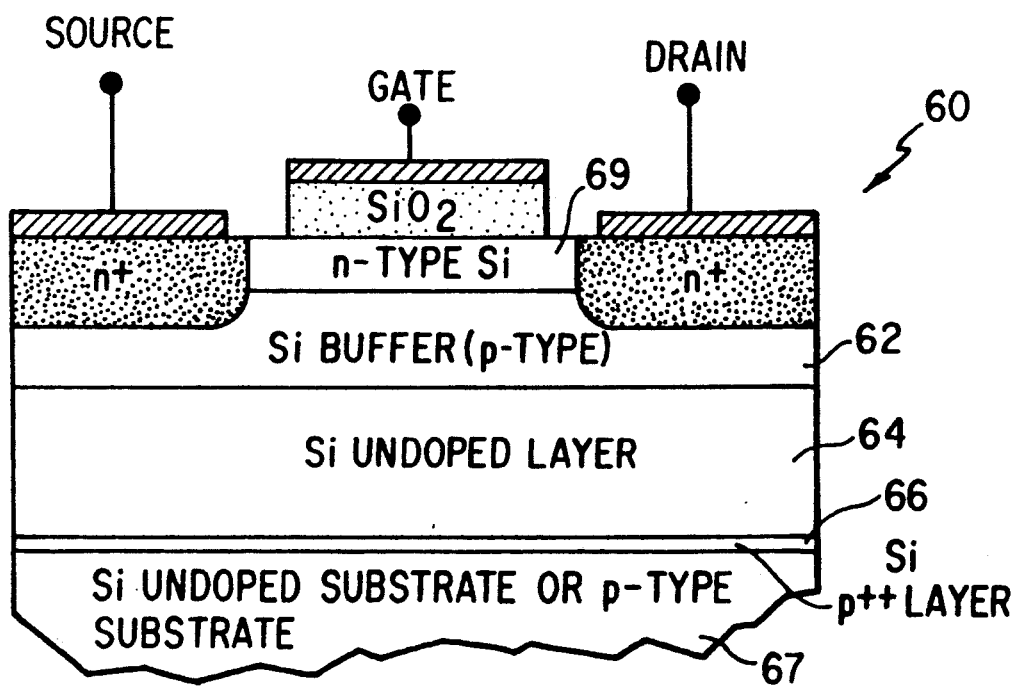
FIG. 11 illustrates a Si MOSFET device constructed to include a tri-partite substrate.

Similarly, Si MOSFET 60 is illustrated in FIG. 11 as including a p-i-p++ layer consisting of a p-type Si buffer layer 62, an undoped Si layer 64 and a more heavily doped p++ Si layer 66. Layers 62, 64 and 66 are disposed between substrate 67 that can be provided as either an insulating or semiconductive layer, and an n-type Si channel region 69.

Thus, it is intended that the present invention cover the modifications and the variations of this invention provided they come within the scope of the appended claims and their equivalents.

What is claimed:

1. A field-effect transistor comprising:
   a substrate of a semi-insulating material;
   a buffer layer disposed on said substrate;
   a channel region comprising a semiconductive material disposed on said buffer layer;
   a barrier layer of a wide bandgap semiconductive material disposed on said channel region;
   a gate layer of a semiconductor material of a first conductivity type disposed on said barrier layer;
   a source region of a second conductivity type opposite said first conductivity type contacting said channel region proximate a first end of said channel region;
   a drain region of said second conductivity type contacting said channel region proximate a second end of said channel region;
   ohmic contact metal regions respectively disposed on said source and drain regions; and
   a gate metal contact disposed on said gate layer to form an ohmic contact therewith;
   wherein said buffer layer includes
   a first layer of doped semiconductive material of said first conductivity type and disposed on said substrate, said first layer having a first dopant concentration,
   a second layer of undoped semiconductive material disposed on said first layer, and
   a third layer of doped semiconductor material of said first conductivity type disposed on said second layer, said third layer contacting said channel region, said third layer having a second dopant concentration that is less than said first dopant concentration of said first layer.

2. The field-effect transistor of claim 1 wherein said first conductivity type is p-type.

3. A field-effect transistor, comprising:
   a semi-insulating substrate of a compound semiconductive material of a III-V type;
   a buffer layer disposed on said substrate and comprising a compound semiconductive material of III-V type;
   a channel region disposed on said buffer layer and comprising a narrow band gap semiconductive material;
   a barrier layer disposed on said channel region and comprising a compound semiconductive material of III-V type;
   a gate layer disposed on said barrier layer and comprising a semiconductive material of a first conductive type;
   a source region of a second conductivity type opposite said first conductivity type contacting said channel region proximate a first end of said channel region;
   a drain region of said second conductivity type contacting said channel region proximate a second end of said channel region;
   ohmic contact metal regions respectively disposed on said source and drain regions; and
   a gate metal contact disposed on said gate layer to form an ohmic contact therewith;
   wherein said buffer layer includes
   a first layer of doped compound semiconductive material of III-V type of said conductivity type and disposed on said substrate, said first layer having a first dopant concentration,
   a second layer of undoped semiconductive material disposed on said first layer, and
   a third layer of compound semiconductive material of III-V type of said first conductivity type disposed on said second layer, said third layer contacting said channel region and said third layer having a second dopant concentration that is less than said first dopant concentration of said first layer.

4. The field-effect transistor of claim 3 wherein said first conductivity type is p-type.

5. The field-effect transistor of claim 3 further including means, coupled to said first layer, for adjusting a threshold voltage of said field-effect transistor.

6. A field-effect transistor of a first conductivity type, comprising:
   a substrate of a semi-insulating material;
   a buffer layer disposed on said substrate;
   a channel region comprising a semiconductive material disposed on said buffer layer;
   a source region of said first conductivity type in contact with a first end of said channel region;
   a drain region of said first conductivity type in contact with a second end of said channel region;
   a gate region disposed above said channel;
   a gate metal contact disposed on said gate region to form an ohmic contact therewith,
   said buffer layer including
   a first layer of doped semiconductor material of a second conductivity type opposite said first conductivity type and disposed on said substrate,
   a second layer of undoped semiconductive material disposed on said first layer, and
   a third layer of semiconductive material of predominantly said second conductivity type in contact with said channel region.

7. The field-effect transistor of claim 6 in which the channel region includes a fourth layer adjacent the third layer, one of said third and fourth layers including doping to provide carriers of the first conductivity type for the channel region.

8. The field-effect transistor of claim 6, in which:
   the substrate includes predominantly a first group III-V compound semiconductor;
   the channel region includes on the third layer a fourth layer of a second group III-V compound semiconductor of the first conductivity type, said third and fourth layers forming a heterojunction; and
   the gate region comprising at least one layer of a group III-V compound semiconductor of the second conductivity type.

9. A field-effect transistor comprising:
   a substrate of a compound semiconductive material of a III-V type having a first bandgap;
   a source region of a second conductivity type opposite a first conductivity type disposed in said substrate;

a drain region of the second conductivity type disposed in said substrate near said source region;

a quantum well layer of the second conductivity type disposed on said substrate between said source region and said drain region, said quantum well layer comprising a compound semiconductive material of a III-V type having a second bandgap smaller than the first bandgap;

a barrier layer disposed on said quantum well layer between said source region and said drain region, said barrier layer comprising a compound semiconductive material of III-V type having a third bandgap larger than said first bandgap;

first and second electrodes contacting the source and drain regions, respectively;

an electrode over a major portion of the area separating the source and drain regions, the electrode comprising in juxtaposition to the barrier layer a gate layer of a compound semiconductive material of a III-V type having the first conductivity type and a gate metal contact disposed on said gate layer to form an ohmic contact therewith;

wherein the substrate includes a first layer adjacent the quantum well layer which first layer is of the first conductivity type, a second layer of substantially intrinsic type adjacent said first layer and separated thereby from said source and drain regions, and a third layer adjacent the second layer and separated thereby from the first layer, said third layer being of the first conductivity type and having a higher dopant concentrations of said first conductivity type than said first layer.

10. A field-effect transistor, comprising:
a substrate of an insulating material;
a buffer layer disposed on said substrate;
a channel region comprising a semiconductive material disposed on said buffer layer;
a barrier layer of a wide bandgap semiconductive material disposed on said channel region;
a gate layer of a semiconductive material of a first conductivity type disposed on said barrier layer;
a source region of a second conductivity type opposite said first conductivity type contacting said channel region proximate a first end of said channel region;
a drain region of said second conductivity type contacting said channel region proximate a second end of said channel region;
ohmic contact metal regions respectively disposed on said source and drain regions; and
a gate metal contact disposed on said gate layer to form an ohmic contact therewith;
wherein said buffer layer includes
a first layer of doped semiconductive material of said first conductivity type and disposed on said substrate, said first layer having a first dopant concentration,
a second layer of undoped semiconductive material disposed on said first layer, and
a third layer of doped semiconductive material of said first conductivity type disposed on said second layer, said third layer contacting said channel region, said third layer having a second dopant concentration that is less than said first dopant concentration of said first layer.

11. A field-effect transistor, comprising:
a substrate of a semiconductive material;
a buffer layer disposed on said substrate;
a channel region comprising a semiconductive material disposed on said buffer layer;
a barrier layer of a wide bandgap semiconductive material disposed on said channel region;
a gate layer of a semiconductive material of a first conductivity type disposed on said barrier layer;
a source region of a second conductivity type opposite said first conductivity type contacting said channel region proximate a first end of said channel region;
a drain region of said second conductivity type contacting said channel region proximate a second end of said channel region;
ohmic contact metal regions respectively disposed on said source and drain regions; and
a gate metal contact disposed on said gate layer to form an ohmic contact therewith;
wherein said buffer layer includes
a first layer of doped semiconductive material of said first conductivity type and disposed on said substrate, said first layer having a first dopant concentration,
a second layer of undoped semiconductive material disposed on said first layer, and
a third layer of doped semiconductive material of said first conductivity type disposed on said second layer, said third layer contacting said channel region, said third layer having a second dopant concentration that is less than said first dopant concentration of said first layer.

* * * * *